(12) United States Patent
Shakuda et al.

(10) Patent No.: US 6,855,962 B2
(45) Date of Patent: Feb. 15, 2005

(54) SEMICONDUCTOR LIGHT EMITTING DEVICE

(75) Inventors: Yukio Shakuda, Kyoto (JP); Yukio Matsumoto, Kyoto (JP); Nobuaki Oguro, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/616,223

(22) Filed: Jul. 10, 2003

(65) Prior Publication Data

US 2004/0065891 A1 Apr. 8, 2004

(30) Foreign Application Priority Data

Jul. 11, 2002 (JP) ........................................ 2002-202069

(51) Int. Cl.[7] .............................................. H01L 33/00
(52) U.S. Cl. ............................. 257/99; 257/95; 257/91; 257/86; 257/94; 257/98; 257/102; 257/103; 257/618
(58) Field of Search .............................. 257/95, 94, 86, 257/93, 96, 97, 92, 88, 99, 91, 98, 102, 103, 618

(56) References Cited

U.S. PATENT DOCUMENTS

| | | | | |
|---|---|---|---|---|
| 5,744,829 A | * | 4/1998 | Murasato et al. ............. 257/94 |
| 6,054,716 A | * | 4/2000 | Sonobe et al. ............... 250/552 |
| 6,242,761 B1 | * | 6/2001 | Fujimoto et al. ............. 257/94 |
| 6,291,840 B1 | * | 9/2001 | Uemura et al. ............... 257/94 |
| 6,586,773 B2 | * | 7/2003 | Saeki et al. .................... 257/86 |
| 6,735,230 B1 | * | 5/2004 | Tanabe et al. ................. 372/43 |

FOREIGN PATENT DOCUMENTS

JP 10242516 * 9/1998 ............ H01L/33/00

* cited by examiner

Primary Examiner—Nathan J. Flynn
Assistant Examiner—Fazli Erdem
(74) Attorney, Agent, or Firm—Rabin & Berdo, PC

(57) ABSTRACT

A semiconductor laminating portion including a light emitting layer forming portion having at least an n-type layer and a p-type layer is formed on a semiconductor substrate. A current blocking layer is partially formed on its surface. A current diffusing electrode is formed on the entire surface thereof. A bonding electrode is formed thereon. The semiconductor laminating portion and the current diffusing electrode are separated into light emitting unit portions A, electrode pad portion B, and connecting portions C for connecting between electrode pad portion B and light emitting unit portions A or between two of the light emitting unit portions A, and the semiconductor laminating portion between the light emitting unit portions A is removed through etching to make clearances except for connecting portions C. The bonding electrode is formed on electrode pad portion B.

14 Claims, 4 Drawing Sheets

SEMICONDUCTOR LIGHT EMITTING DEVICE

FIELD OF THE INVENTION

The present invention relates to a semiconductor light emitting device arranged in that it is capable of extracting light, which is emitted from a light emitting layer forming portion in which a light emitting layer is formed by laminating semiconductor layers, to the utmost from a light emitting device chip (hereinafter also referred to as "LED chip") and of improving the luminance with respect to the same amount of input. More particularly, it relates to a light emitting device arranged in that light is effectively extracted from side surfaces of light emitting portions so as to achieve improvements in light extraction efficiency of emitted light to the exterior.

BACKGROUND OF THE INVENTION

A conventional type visible light semiconductor light emitting device employing, for instance, $In_{0.49}(Ga_{1-z}Al_z)_{0.51}P$ based compound semiconductor may be arranged as exemplarily illustrated in FIG. 4. That is, FIG. 4 illustrates a light emitting layer forming portion 29 of double hetero structure in which there are deposited, on a semiconductor substrate 21 of n-type GaAs, an n-type clad layer 22 made of a n-type InGaAlP based semiconductor material, an active layer 23 made of a InGaAlP based semiconductor material having a composition with which the band gap energy becomes smaller than that of the clad layers, and a p-type clad layer 24 of a p-type InGaAlP based semiconductor material, respectively, through epitaxial growing. A p-type window layer (current diffusing layer) 25 made of an AlGaAs based compound semiconductor is further deposited on a surface thereof. Moreover, a p-side electrode 27 is formed on a central portion of this surface with a contact layer 26 of GaAs being interposed between them while an n-side electrode 28 is formed on a rear surface of the semiconductor substrate.

The window layer 25 is employed for the purpose of achieving two functions, namely enabling easy extraction of light from side surfaces and enabling easy light emission at the light emitting layer forming portion on the entire surface of the chip by diffusing current for spreading the same over the entire surface of the chip, and it is formed by a semiconductor layer of small light absorption rate and large carrier density.

In such a semiconductor light emitting device, light directed towards the p-side electrode 27 that is provided on the surface side will be shielded by this electrode 27 so that no light can be extracted to the surface side. For eliminating such loss, it is known to provide an arrangement in which a semiconductor layer of different conductivity from the conductivity of the adjoining semiconductor layers or an insulating layer is interposed between any of the semiconductor layers, which is underlying the p-side electrode 27 as indicated by 31 in FIG. 5 so as to restrict current to directly underneath the p-side electrode 27 and thus to avoid emitting light directly underneath thereof.

As already discussed, in a conventional semiconductor light emitting device in which light is extracted from a surface side of laminated semiconductor layers, light emitted in the interior cannot be sufficiently extracted since light is shielded by an electrode that is provided on the surface side. Such an electrode on the surface side requires a bonding area of approximately 80 to 100 $\mu m\phi$ for wire bonding or the like, in a size of the chip area of approximately 200 to 300 $\mu m$ square, which leads to a drawback in that most of the area is shielded by the electrode so as to degrade the efficiency of extraction of light to the exterior.

Further, even though current is prevent from flowing by providing a current blocking layer downward of the upper electrode (p-side electrode) as illustrated in the above-mentioned FIG. 5, current will still flow to the active layer portion further downward thereof to cause emission of light, and even if emission of light has been successively been prevented, light emitted in the periphery thereof will be absorbed by the active layer, which is a portion that does not emit light, so that portions that emit light downward of the upper electrode cannot be effectively used.

Moreover, when trying to extract light from sidewall of the chip, the side wall will only be the periphery of the rectangular chip while the light emitting region is, in the presence of a region in which current injection is blocked, substantially the entire surface of the chip area of the active layer that is formed to be vertical with respect to the side wall excluding the above blocking region, and light emitted in the interior such as the central portion of the chip cannot be effectively extracted to the exterior owing to factors such as absorption by the semiconductor layers.

SUMMARY OF THE INVENTION

The present invention has been made for solving such problems, and it is an object thereof to provide a semiconductor light emitting device of an arrangement with which light emitted in a light emitting layer forming portion can be effectively extracted to the exterior for improving the luminance with respect to input.

The semiconductor light emitting device according to the present invention includes; a semiconductor substrate, a semiconductor laminating portion formed on the semiconductor substrate, which includes a light emitting layer forming portion having at least an n-type layer and a p-type layer, a current diffusing electrode formed on the semiconductor laminating portion, which exhibits translucency and electric conductivity, a bonding electrode formed on a part of the current diffusing electrode, and an electrode formed on a rear surface of the semiconductor substrate, wherein the semiconductor laminating portion and the current diffusing electrode are separated into a plurality of light emitting unit portions, an electrode pad portion, and connecting portions for connecting between the electrode pad portion and the light emitting unit portions or between two of the light emitting unit portions, and wherein the bonding electrode is provided on the electrode pad portion, and the electrode pad portion is formed so as to make the light emitting layer forming portion in the electrode pad portion nonluminous.

For forming the current diffusing electrode, it is possible to form an alloy layer of Au—Ge or Au—Ni to have a thickness of approximately 2 to 200 nm or to utilize an ITO layer. For making the light emitting layer forming portion nonluminous, it is possible to insert a current blocking layer such as an insulating layer or a semiconductor layer having a conductivity that is different from the conductivity of the adjoining semiconductor layers, between the current diffusing electrode and the electrode on the rear surface of the semiconductor substrate.

It is preferable that the size of the light emitting units portions is formed such that its diameter, when it is of circular planar shape, or its longer side or its longer diameter, when it is of rectangular or elliptic shape, is not more than six times of the height of the semiconductor laminating portion since also light emitted in the central portion may be extracted to the exterior. By setting a distance between adjoining two of a plurality of light emitting unit portions to be not less than twice of the height of the semiconductor laminating portion, extracted light may be utilized without any mutual interference and cancellation so that the luminance may be improved.

With this arrangement, the light emitting unit portions and the electrode pad portion are formed to be separate from each other while the electrode pad portion is also formed to be nonluminous, neither will current be wasted nor will light emitted at the light emitting unit portions be absorbed by nonluminous portions such as the electrode pad portion; moreover, since light emitting unit portions are provided separately by a plurality of numbers, light emitted at the respective light emitting unit portions will not cancel each other in lateral directions but may be easily extracted immediately from the side walls for effective utilization thereof. It is consequently possible to extremely improve the luminance of light that may be effectively utilized and thus to remarkably improve efficiency of light emission.

DETAILED DESCRIPTION

Figure 1A:
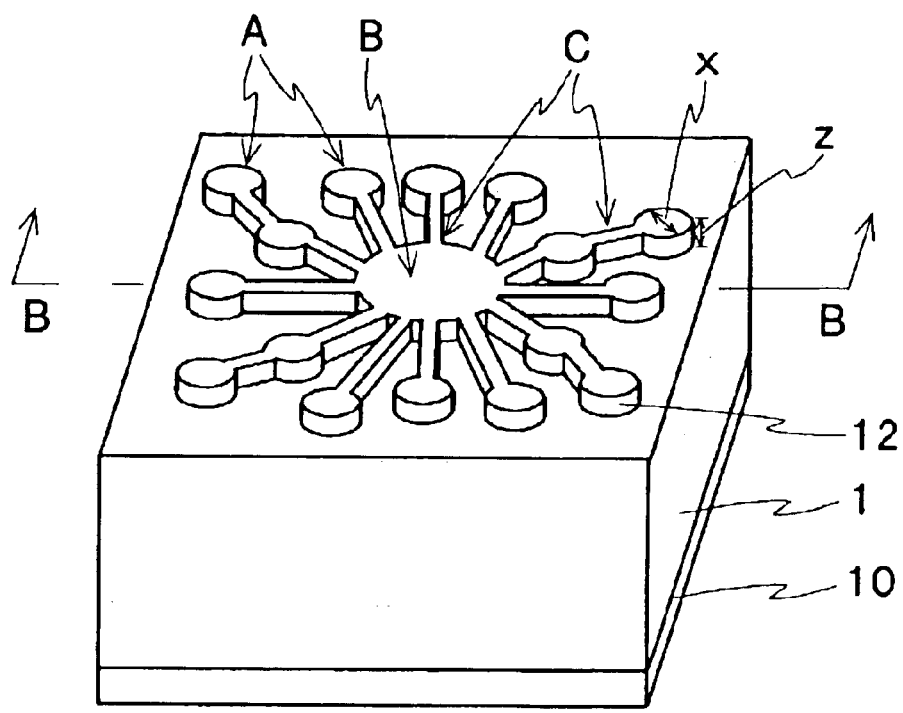
FIG. 1A and FIG. 1B are a perspective and a sectional explanatory view of an LED chip illustrating one embodiment of the present invention.

A semiconductor light emitting device according to the present invention will now be explained while referring to the drawings. The semiconductor light emitting device according to the invention is arranged, as explanatory illustrated in FIGS. 1A and 1B as a schematic perspective view of one embodiment thereof and as an explanatory view seen from section B—B in FIG. 1A, in that a semiconductor laminating portion 12 including a light emitting layer forming portion 11 having at least an n-type layer 2 and a p-type layer 4 is formed on a semiconductor substrate 1. On the semiconductor laminating portion 12, there are provided a current blocking layer 7 in a partial portion and a current diffusing electrode 8 on the entire surface thereof that exhibits translucency and electric conductivity. A bonding electrode 9, which is one electrode of a pair of electrodes, is formed on a part of the current diffusing electrode 8 and the other electrode 10 is provided on the rear surface of the semiconductor substrate, respectively.

The above semiconductor laminating portion 12 and the current diffusing electrode 8 are separated into a plurality of light emitting unit portions A, an electrode pad portion B and connecting portions C for connecting between the electrode pad B and the light emitting unit portions A or between two of the light emitting unit portions A, wherein clearance portions between the respective light emitting unit portions A are formed by removing the semiconductor laminating portion 12 except for the connecting portions C through etching so that the respective light emitting unit portions A and the electrode pad portion B project in a piled manner while each of them is connected by the connecting portion C as illustrated in FIG. 1A. The above-described bonding electrode 9 is formed on the electrode pad portion B and the current blocking layer 7 is provided only in the electrode pad portion B and the connecting portions C so that current can be blocked from flowing to the underlying light emitting layer forming portion 11 so that this portions is nonluminous region.

Namely, other portions than the light emitting unit portions A are provided with a current blocking layer 7 such that current is injected to the light emitting unit portions A only, and the light emitting unit portions A are provided upon being separated into a plurality of numbers. Since the current diffusing electrode 8 is provided on the surface of the light emitting unit portions A so that current may be diffused while permitting light to pass through, light emitted at the light emitting unit portions A may be extracted not only from their upper surface sides but also from their side walls. On the other hand, while no light may pass through the electrode pad portion B since the bonding electrode 9 is formed on the surfaces of the electrode pad portion B, no current will be injected to the light emitting layer forming portion 11 in the electrode pad portion B to cause no light emission since the electrode pad portion B is provided with the current blocking layer 7.

Figure 1B:
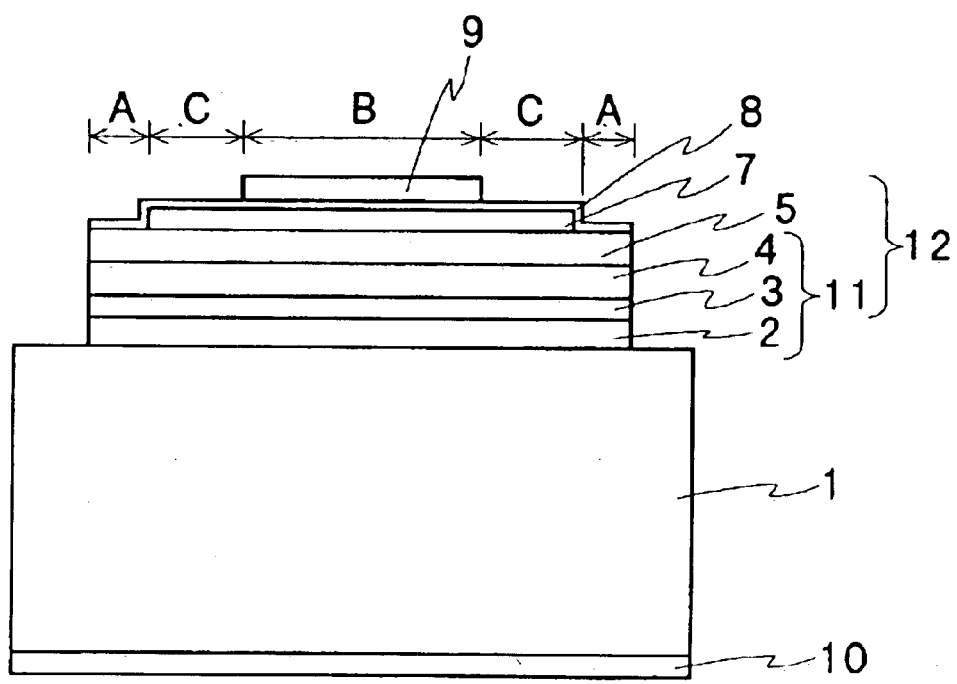

The connecting portions C are for transmitting an electric potential that is applied to the bonding electrode 9 to the respective light emitting unit portions A, and in the example as illustrated in FIGS. 1A and 1B, the connecting portions C are also formed with the current blocking layer 7 so that no light is emitted at the connecting portions C as well. When the connecting portions C are also arranged to be nonluminous, their surfaces may be formed with the same metallic electrode as the bonding electrode; alternatively, when using the current diffusing electrode 8 only, the connecting portions C may also function as light emitting regions by omitting the current blocking layer 7.

Figure 2A:
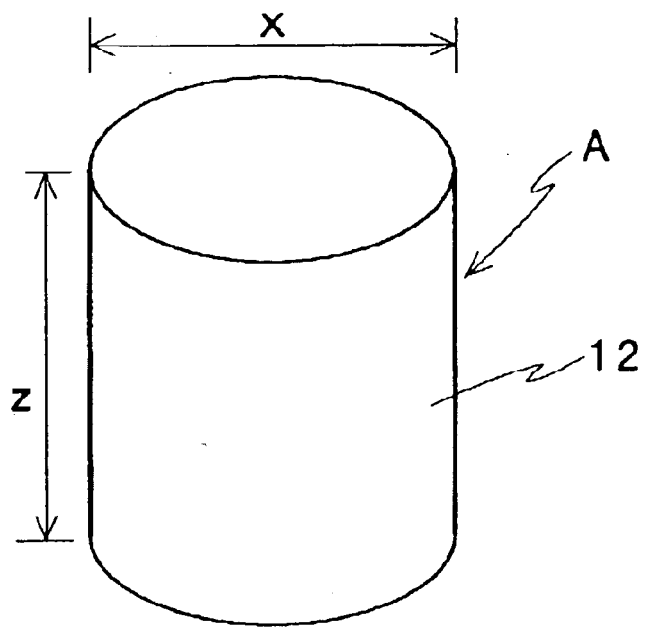
FIGS. 2A and 2B are views for explaining a suitable example of size and distance between two of the light emitting unit portions as illustrated in FIG. 1.

The relationship between light emitting unit portions A, the electrode pad portion B and the connecting portions C may be defined such that x and z in FIG. 1A satisfy the following relationship (note that FIG. 1 is a schematic view wherein the relationship of size is not necessarily accurate, and that the semiconductor laminating portion 12 of FIG. 1B is illustrated in thickened form). More particularly, it is preferable that the size (diameter x) of each of the light emitting unit portions A is not too large for enabling extraction of light emitted in the interior thereof not only from their surfaces but also from their side walls. The inventors of the present invention studied hard to find out, upon variously changing the thickness z of the semiconductor laminating portion 12 and the diameter x of the light emitting unit portions A (see FIG. 2A), that light can be effectively extracted by setting the size of the thickness z of the semiconductor laminating portion 12 and the diameter x such that $z \geq x/6$ is satisfied. The thickness z of the semiconductor laminating portion 12 may be formed to be approximately 3 to 10 $\mu$m whereas the diameter of each of the light emitting unit portions A is formed to be approximately to 10 to 50 $\mu$m.

In other words, the inventors have found out that the above-mentioned specified relationship holds between the thickness z and the diameter x of each of the light emitting unit portions A, wherein while light emitted at the light emitting portions A can be easily extracted to the exterior even when the planar area of the light emitting unit portions A is large, provided that the thickness z of the semiconductor laminating portion 12 is large, it will become difficult to extract light emitted in the central portions of the light emitting unit portions A when the thickness of the semiconductor laminating portion 12 is small.

The planar shape of each of the light emitting layer unit portions A is not limited to the circular shape as illustrated in FIG. 1. A circular planar shape is preferable since light irradiated in every direction from the central portion will be directed substantially vertical to the side walls regardless of their direction of propagation so that the angle of incidence may be made small to thereby enable easy extraction to the exterior. However, since light is emitted at every portion of the active layer 4 of the light emitting unit portions A and moreover, since such light will propagate in every direction not only within a planar plane but also in vertical directions, the planar shape is not limited to a circular one but may alternatively be rectangular, square or elliptical, resulting in no particular differences. In this case, light can be effectively extracted when a relationship substantially identical to the above-described relationship between the thickness z of the semiconductor laminating portion and the size is satisfied, wherein the dimension of the longer side or the dimension of the diagonal line is employed as the value of the above x.

Figure 2B:
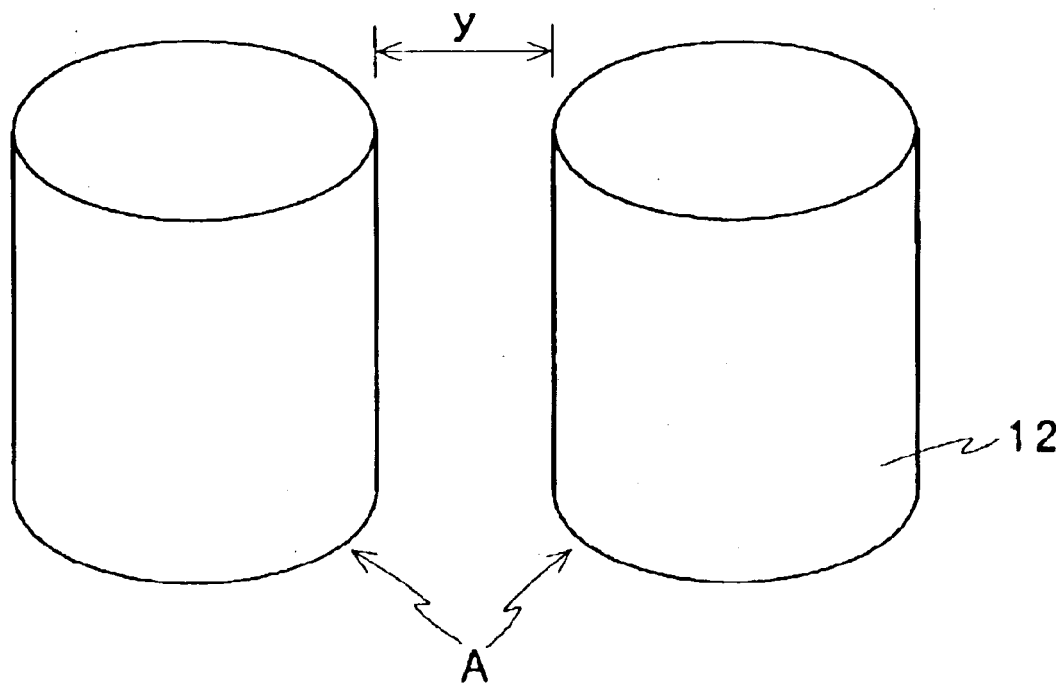

Further, when the clearance between adjoining two of the light emitting unit portions A is too small, light extracted from one light emitting unit portion A will interfere with light extracted from an adjoining light emitting unit portion A to be cancelled, and it is thus necessary to provide a specified distance. The inventors of the present invention performed tests upon variously changing the distance y between two of the light emitting unit portions A as illustrated in FIG. 2B to find out that this distance y is also closely related to the thickness z of the semiconductor laminating portion 12 and that light could be effectively extracted by satisfying $y \geq 2z$.

The wire bonding electrode 9 is provided on the surface of the current diffusing electrode 8 of the electrode pad portion B. More particularly, a conventional semiconductor light emitting device exhibited a drawback that an electrode for connection with a power source for supplying voltage needed to be provided on both, upper and lower surfaces of the light emitting device chip wherein no light was allowed to pass through the wire bonding electrode 9 so that light emitted downward thereof could not be effectively utilized. A great loss was also caused since the portion of the bonding electrode 9 occupied quite a large area of, for instance, approximately 80 to 100 $\mu$m$\phi$ with respect to a chip size of approximately 330 $\mu$m square.

The present invention has thus been arranged in that a portion for forming the bonding electrode 9 thereon is separated from the light emitting unit portions A as electrode pad portion B and in that the current blocking layer 7 is formed in the electrode pad portion B so that current is completely prevented from flowing. It has consequently been enabled to eliminate losses in which light is not emitted by not being injected current to the light emitting layer forming portion under the bonding electrode, and further to remarkably reduce a ratio of absorption of light, which emits from the light emitting unit portions A adjoining to the electrode pad portion B and enters into the active layer of the electrode pad portion B.

The connecting portions C are provided for transmitting voltage of an external power source applied to the bonding electrode 9 to the respective light emitting unit portions A via the current diffusing electrode 8. In the example illustrated in FIG. 1, the current blocking layer 7 is provided in the connecting portions C so that no current is made to flow for preventing emission of light. However, it is possible to alternatively employ an arrangement in which the connecting portions C are also arranged to emit light with no current blocking layer 7 being provided in the connecting portions C.

When the connecting portions C are not arranged to emit light, the same metallic electrode as the bonding electrode 9 may be formed on the current diffusing electrode 8. When not particularly arranged to emit light, the connecting portions C shall simply conduct voltage to the respective light emitting unit portions A with little loss by resistance, and the smaller the width thereof is, the better it is. Though depending on the fact whether a metallic electrode film (the same metallic film as the bonding electrode 9) is provided or not, hardly any ohmic dissipation will be generated for allowing current to flow through with a width of approximately 5 to 20 $\mu$m. When the connecting portions C are also to emit light, the width shall be set to be not more than the above-mentioned value for x.

As for the semiconductor substrate 1, while GaAs is generally employed for growing a semiconductor laminating portion of AlGaAs based semiconductor or InGaAlP based semiconductor, the substrate may also be of a material such as GaP permitting transmission of light. The semiconductor substrate 1 may be either of p-type or n-type, depending on the relationship with the semiconductor laminating portion 12 that is to grow on the semiconductor substrate 1.

In the example as illustrated in FIG. 1, the light emitting layer forming portion 11 is arranged as a double hetero structure in which the active layer 3 is sandwiched between the n-type clad layer 2 and the p-type clad layer 4 made of a material having a larger band gap than that of the active layer 3, wherein InGaAlP based semiconductor is mainly used for obtaining red light and AlGaAs based semiconductor for infrared light. For growing the light emitting layer forming portion 11, a required composition and a required thickness is selected depending on the desired emission wavelength for the device (i.e. changing a composition ratio of Al or doping a dopant).

Here, an InGaAlP based semiconductor is expressed in the form of $In_{0.49}(Ga_{1-u}Al_u)_{0.51}P$ and indicates a material in which the value of u is variously changed in the range of 0 to 1. The mixed crystal ratio 0.49 and 0.51 between In and $(Al_u\text{—}Ga_{1-u})$ indicates a ratio of lattice matching between the InGaAlP based semiconductor that is to be laminated and the semiconductor substrate of GaAs or similar, and an AlGaAs based semiconductor is expressed in the form of $Al_vGa_{1-v}As$ and indicates a material in which the value of v is variously changed in the range of 0 to 1.

In one concrete example in which the element is made of, for instance, an InGaAlP based compound semiconductor, it is formed as a laminated structure including an n-type clad layer 2 of Se-doped $In_{0.49}(Ga_{0.25}Al_{0.75})_{0.51}P$ and having a carrier density of approximately $1 \times 10^{17}$ to $1 \times 10^{19}$ cm$^{-3}$ and a thickness of approximately 0.1 to 2 $\mu$m, an active layer 3 of undoped $In_{0.49}(Ga_{0.8}Al_{0.2})_{0.51}P$ and having a thickness of approximately 0.1 to 2 $\mu$m, and a p-type clad layer 4 of Zn-doped InGaAlP based compound semiconductor having a composition that is identical to that of the n-type clad layer 2 and having a carrier density of approximately $1 \times 10^{16}$ to $1 \times 10^{19}$ cm$^{-3}$ and a thickness of approximately 0.1 to 2 $\mu$m.

Alternatively, when the device is comprised of AlGaAs based compound semiconductor, it is formed as a laminated structure including an n-type clad layer 2 of Se-doped $Al_{0.7}Ga_{0.3}As$ and having a carrier density of approximately $1\times10^{17}$ to $1\times10^{19}$ cm$^{-3}$ and a thickness of approximately 0.1 to 2 µm, an active layer 3 of undoped $Al_{0.2}Ga_{0.8}As$ and having a thickness of approximately 0.1 to 2 µm, and a p-type clad layer 4 of Zn-doped AlGaAs based compound semiconductor having a composition that is identical to that of the n-type clad layer 2 and having a carrier density of approximately $1\times10^{16}$ to $1\times10^{19}$ cm$^{-3}$ and a thickness of approximately 0.1 to 2 µm.

A window layer 5 of, for instance, p-type $Al_wGa_{1-w}As$ ($0.5\leq w\leq 0.8$) is then formed onto the p-type clad layer 4 of the light emitting layer forming portion 11 by approximately 1 to 10 µm to comprise a semiconductor laminating portion 12 together with the above light emitting layer forming portion 11.

In the electrode pad portion B and the connecting portions C, a current blocking layer 7 is provided on the semiconductor laminating portion 12. The current blocking layer 7 may be formed as an insulating layer such as $SiO_2$ or as a semiconductor layer having a conductivity that is different from that of the adjoining semiconductor layers such as an n-type AlGaAs based compound semiconductor layer on the p-type window layer 5, and is formed to have a thickness of approximately 0.1 to 0.4 µm. While the current blocking layer 7 is not formed in the light emitting unit portions A, it is also possible to refrain from forming this layer in the connecting portions C as well so as to make the connecting portions C emit light.

The current diffusing electrode 8 is formed as a layer that makes current flow between the bonding electrode 9 and the respective light emitting unit portions A while further allowing light pass through such that light emitted in the active layer 3 of the light emitting unit portions A may be extracted to the surface side without being shielded. As for the current diffusing electrode 8, an alloy layer such as Au—Ge or Au—Ni is formed to have a thickness of approximately 2 to 100 nm, and more preferably to be not more than approximately 10 nm. It is also possible to employ an ITO film as the current diffusing electrode 8. The current diffusing electrode 8 is provided over substantially the entire surface, regardless of the presence or absence of the current blocking layer 7. However, portions at which the light emitting unit portions A are separated are removed together with the semiconductor laminating portion 12.

The chip is formed by respectively forming a bonding electrode (p-side electrode) 9 of Au—Be/Ni/Ti/Au or similar on the surface side of the current diffusing electrode 8 on the electrode pad portion B while the other electrode (n-side electrode) of Au—Ge/Ni/Au or similar is formed on the rear surface of the semiconductor substrate 1.

Though not shown in the example of FIG. 1, it is also possible to insert a reflecting layer (DBR; Distributed Brag Reflector) in which semiconductor layers of different refractive indices are alternately laminated by layers of 5 to 40 to be of a thickness of $\lambda/(4n)$ (wherein $\lambda$ indicates a light emitting wavelength and n a refractive index of the semiconductor layer), and a buffer layer between the n-type clad layer 2 and the semiconductor substrate 1. It is possible to form an n-type window layer to be of the same composition as the window layer 5 also on a semiconductor substrate side surface of the n-type clad layer 2.

The reflecting layer (DBR) may be obtained by a layer that has a band gap that is larger than that of the active layer or the substrate, for instance, by a laminated structure in which the composition of Al of AlGaAs based semiconductor has been changed. The buffer layer may be a layer that is made of the same material as that of the semiconductor substrate 1 or a layer with which lattice mismatching between the semiconductor substrate 1 and the semiconductor layers on the semiconductor substrate can be eased; for instance, where the semiconductor laminating portion 12 is of InGaAlP based compound and the semiconductor substrate 1 is of GaAs, GaAs, InGaP or InGaAlP based compound may be used, and where the semiconductor laminating portion 12 is of AlGaAs based compound and the semiconductor substrate 1 is of GaAs, GaAs or AlGaAs based compound may be used.

For manufacturing such an LED chip, it is possible to put an n-type GaAs substrate 1 into a MOCVD (metal organic chemical vapor deposition) apparatus, and to introduce required gases for growth together with a carrier gas of hydrogen ($H_2$), of reaction gases such as triethylgallium (hereinafter referred to as TEG), trimethylaluminum (hereinafter referred to as TMA), trimethylindium (hereinafter referred to as TMIn) and phosphin (hereinafter referred to as $PH_3$) and $H_2Se$ as an n-type dopant gas.

Figure 3A:
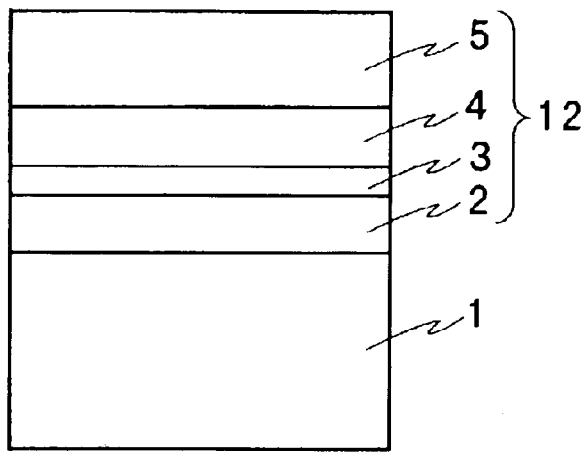
FIGS. 3A to 3D are explanatory views illustrating processes for manufacturing the LED chip as illustrated in FIG. 1.

First, as illustrated in FIG. 3A, epitaxial growth is performed at 500 to 700° C. to obtain an n-type clad layer 2 of $In_{0.49}(Ga_{0.25}Al_{0.75})_{0.51}P$ having a carrier density of approximately $1\times10^{16}$ to $1\times10^{19}$ cm$^{-3}$ by approximately 0.5 µm on the surface of the semiconductor substrate 1. Then, the amount of the reaction gas TMA is reduced to increase the amount of TEG for forming an active layer 3 of undoped $In_{0.49}(Ga_{0.8}Al_{0.2})_{0.51}P$ by approximately 0.5 µm, and the dopant gas is changed to dimethyl zinc (DMZn) by using the same reaction gas as the n-type clad layer 12 for forming a p-type clad layer 4 of p-type $In_{0.49}(Ga_{0.25}Al_{0.75})_{0.51}P$ having a carrier density of approximately $1\times10^7$ to $1\times10^{19}$ cm$^{-3}$ by approximately 1 µm and a p-type window layer 5 of p-type $Al_{0.7}Ga_{0.3}As$ having a carrier density of approximately $1\times10^{17}$ to $1\times10^{20}$ cm$^{-3}$ to thereby obtain the semiconductor laminating portion 12.

Figure 3B:
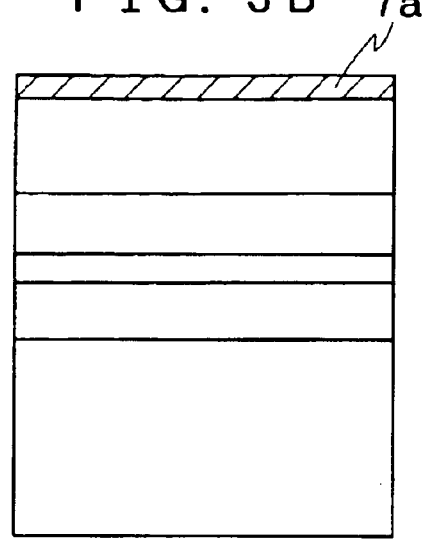
Figure 3C:
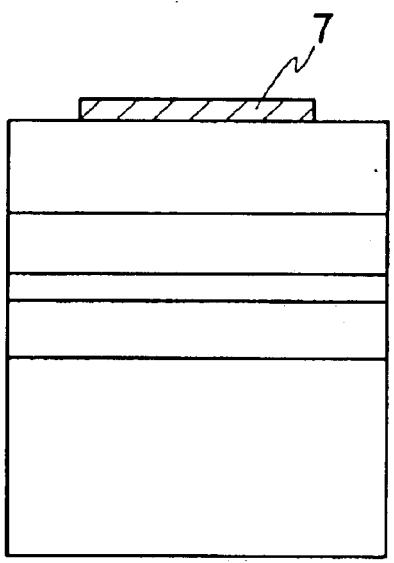

Then, as illustrated in FIG. 3B, an $SiO_2$ layer 7a is formed on the surface thereof through, for instance, CVD method, to assume a thickness of approximately 0.02 to 0.4 µm. Then, a resist film (not shown) is formed on the surface thereof to perform patterning through photolithographic techniques such that the resist film remains only on the electrode pad portion B and the connecting portions C whereupon the remaining resist film is used as a mask for performing etching of the $SiO_2$ layer 7a using hydrofluoric acid and for accordingly forming the current blocking layer 7 only on the surface of the electrode pad portion B and the connecting portions C.

Figure 3D:
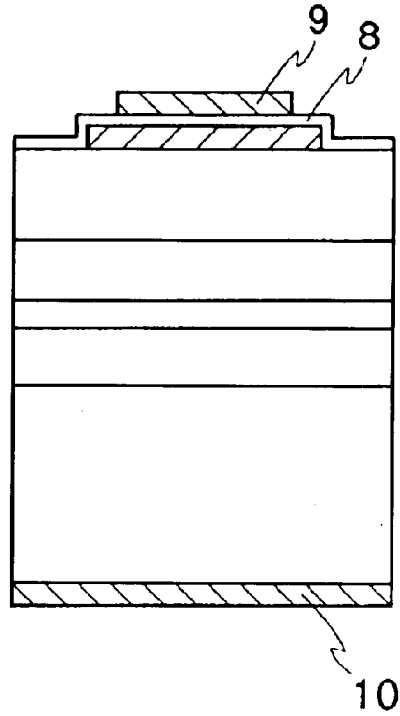
Figure 4:
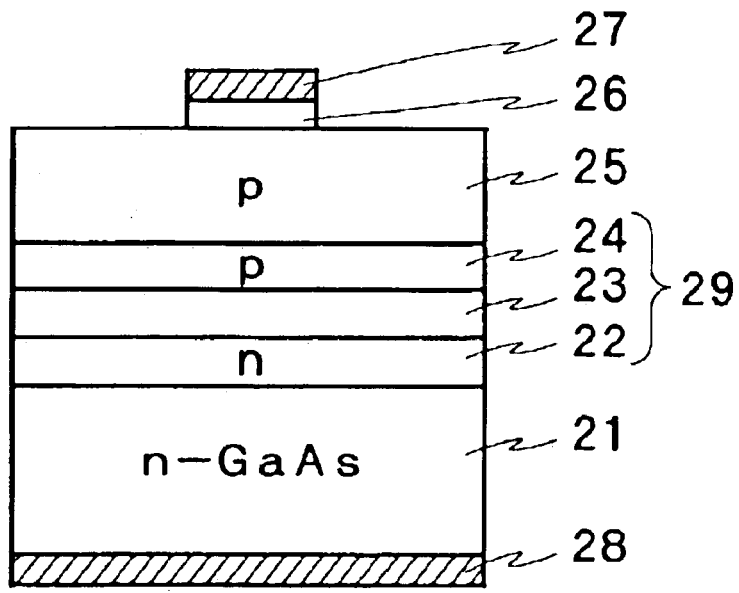
FIG. 4 is a sectional explanatory view illustrating a exemplar structure of a conventional LED chip.
Figure 5:
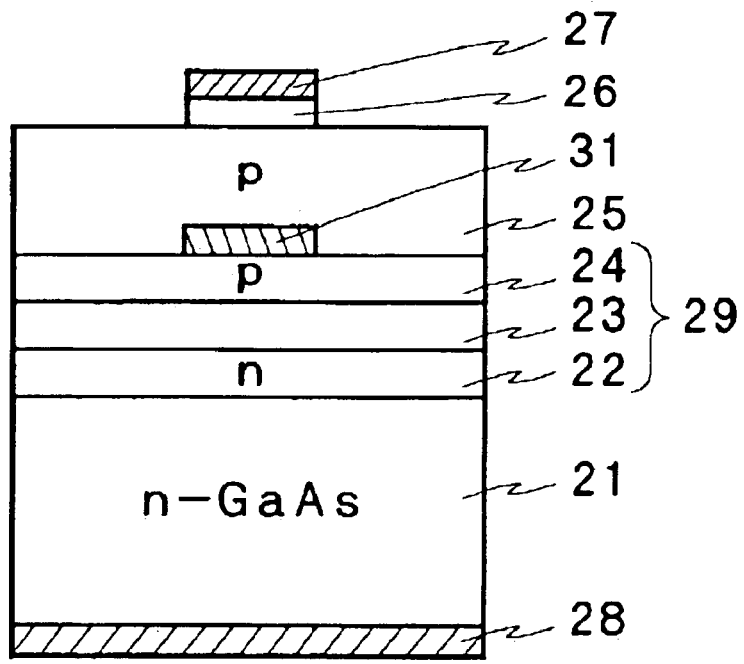
FIG. 5 is a sectional explanatory view illustrating an exemplar structure of a conventional LED chip.

Thereafter, as illustrated in FIG. 3D, Ni and Au are deposited onto the entire surface and carried on sintering so that the current diffusing electrode 8 of Au—Ni alloy is formed to assume a thickness of approximately 10 nm. A resist film is formed on the electrode pad portion B on the surface thereof such that the bonding electrode 9 may be formed, and the bonding electrode (p-side electrode.) 9 of Au—Be/Ni/Ti/Au or similar is formed through lift-off to have a thickness of approximately 0.2 µm, and the other electrode (n-side electrode) 10 of Au—Ge/Ni/Au or similar is formed on the entire rear surface of the semiconductor substrate 1.

A mask is then formed through photolithographic techniques so as to cover only the surface of light emitting unit portions A, the electrode pad portion B and the connecting portions C, and the exposed current diffusing electrode 8 is etched by using an etching solution of iodine and potassium iodide and the semiconductor laminating portion 12 is etched by a liquid in which hydrochloric acid and water is mixed at a ratio of 1:1 to 2:1 (wherein HCl is 47 wt %) at room temperature for approximately 3 minutes (at a rate of 6 μm/min) so as to reach the semiconductor substrate 1. Thereafter, dicing is performed such that the size of the chip becomes, for instance, 330 μm by 330 μm to thus obtain the light emitting device chip as illustrated in FIG. 1.

The present invention is characterized in that the light is not emitted at a portion which the light is shielded by the electrode by separating the electrode pad portion from the light emitting unit portions and by preventing current from flowing to the light emitting layer forming portion of the electrode pad portions to make them nonluminous, and in that light emitted at the light emitting layer forming portion can be effectively extracted to outside of the semiconductor layers from the side walls by separating the light emitting layer forming portions into a plurality of light emitting unit portions without successive layers on the entire chip surface. The ratio of light that can be used upon extraction to the exterior with respect to the same amount of input (overall light emitting efficiency) could be remarkably improved, and an improvement by 120% in luminance with respect to the same mount of input could be achieved when compared to a luminance of a LED of conventional structure.

While the light emitting layer forming portion of the above-described example was of double hetero structure in which a non-doped active layer is sandwiched between n-type and p-type clad layers having a larger band gap than that of the active layer, it is alternatively possible to employ a pn junction structure in which the p-type layer and the n-type layer are directly joined. The conductivity of the semiconductor substrate side may be of p-type and the conductivity of the above-described respective semiconductor layers opposite thereto.

According to the present invention, since current injection is performed in an extremely effective manner, emitted light may be effectively extracted without loss and remarkably large optical outputs may be obtained with respect to the same amount of power input.

Although preferred examples have been described in some detail it is to be understood that certain changes can be made by those skilled in the art without departing from the spirit and scope of the invention as defined by the appended claims.

What is claimed is:

1. A semiconductor light emitting device comprising:
   a semiconductor substrate;
   a semiconductor laminating portion formed on said semiconductor substrate, said semiconductor laminating portion including a light emitting layer forming portion having at least an n-type layer and a p-type layer;
   a current diffusing electrode formed on said semiconductor laminating portion, said current diffusing electrode exhibiting translucency and electric conductivity;
   a bonding electrode formed on a part of said current diffusing electrode; and
   an electrode formed on a rear surface of said semiconductor substrate,
   wherein said semiconductor laminating portion and said current diffusing electrode are separated into a plurality of light emitting unit portions, an electrode pad portion, and connecting portions for connecting between said electrode pad portion and said light emitting unit portions or between two of said light emitting unit portions, and
   wherein said bonding electrode is provided on said electrode pad portion, and said electrode pad portion is formed so as to make said light emitting layer forming portion in said electrode pad portion be nonluminous.

2. The semiconductor light emitting device of claim 1, wherein said connecting portions are formed so as to make said light emitting layer forming portion in each of said connecting portions be nonluminous.

3. The semiconductor light emitting device of claim 2, wherein a metallic electrode is formed on said current diffusing electrode of each of said connecting portions.

4. The semiconductor light emitting device of claim 1, wherein a current blocking layer is formed on one layer between said current diffusing electrode and said semiconductor substrate to be nonluminous.

5. The semiconductor light emitting device of claim 4, wherein said current blocking layer is an electrically-insulating layer, or a semiconductor layer, that has different conductivity from that of semiconductor layers adjoining to said current blocking layer.

6. The semiconductor light emitting device of claim 1, wherein when the planar shape of each of said light emitting unit portions is circular, the size of each of said light emitting unit portions is defined such that the diameter thereof is not more than six times of the thickness of said semiconductor laminating portion.

7. The semiconductor light emitting device of claim 6, wherein the thickness of said semiconductor laminating portion is approximately 3 to 10 μm and the diameter of each of said light emitting unit portions is approximately 10 to 50 μm.

8. The semiconductor light emitting device of claim 1, wherein when the planar shape of each of said light emitting unit portions is rectangular or elliptic, the size of each of said light emitting unit portions is defined such that a longer side or a longer diameter thereof is not more than six times of the thickness of said semiconductor laminating portion.

9. The semiconductor light emitting device of claim 1, wherein a distance between adjoining two of said light emitting unit portions is defined to be not less than twice of the thickness of said semiconductor laminating portion.

10. The semiconductor light emitting device of claim 1, wherein said current diffusing electrode is made of an Au—Ge or Au—Ni alloy layer having a thickness of 2 to 100 nm.

11. The semiconductor light emitting device of claim 1, wherein said current diffusing electrode is an ITO film.

12. The semiconductor light emitting device of claim 1, wherein said semiconductor laminating portion is made of an InGaAlP based material or an AlGaAs based material.

13. The semiconductor light emitting device of claim 1, further comprising a current blocking layer formed on one layer between said current diffusing electrode and said semiconductor substrate, in portions of said semiconductor laminating portion in which said light emitting layer forming portion is to be nonluminous.

14. The semiconductor light emitting device of claim 13, wherein said current blocking layer is formed between said current diffusing layer and said light emitting layer forming portion.

* * * * *